(12) United States Patent
Liu et al.

(10) Patent No.: US 12,341,141 B2
(45) Date of Patent: Jun. 24, 2025

(54) DISPLAY PANEL

(71) Applicant: TCL CHINA STAR OPTOELECTRONICS TECHNOLOGY CO., LTD., Shenzhen (CN)

(72) Inventors: Jing Liu, Shenzhen (CN); Hongzhao Deng, Shenzhen (CN); Zhengbo Cui, Shenzhen (CN); Yichen Bai, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/765,588

(22) PCT Filed: Mar. 30, 2022

(86) PCT No.: PCT/CN2022/084132
§ 371 (c)(1),
(2) Date: Mar. 31, 2022

(87) PCT Pub. No.: WO2023/173497
PCT Pub. Date: Sep. 21, 2023

(65) Prior Publication Data
US 2024/0055418 A1 Feb. 15, 2024

(30) Foreign Application Priority Data
Mar. 16, 2022 (CN) .......................... 202210257463.0

(51) Int. Cl.
*H01L 25/16* (2023.01)
*H10D 86/40* (2025.01)
*H10D 86/60* (2025.01)

(52) U.S. Cl.
CPC ......... *H01L 25/167* (2013.01); *H10D 86/441* (2025.01); *H10D 86/60* (2025.01)

(58) Field of Classification Search
CPC ..... H01L 25/167; H01L 27/124; H10D 86/60; H10D 86/441
See application file for complete search history.

(56) References Cited

FOREIGN PATENT DOCUMENTS

| CN | 109285514 A | 1/2019 |
|---|---|---|
| CN | 110649059 A | 1/2020 |

(Continued)

OTHER PUBLICATIONS

PCT International Search Report for International Application No. PCT/CN2022/084132, mailed on Nov. 25, 2022, 10pp.

(Continued)

*Primary Examiner* — Anne M Hines
(74) *Attorney, Agent, or Firm* — The Roy Gross Law Firm, LLC; Roy D. Gross

(57) ABSTRACT

A display panel is provided, including a power line, light-emitting lamp groups, partition channel wirings, driving chips, and a grounding signal wiring. The driving chips, the light-emitting lamp groups, and the partition channel wirings are disposed between the power line and the grouping signal wiring spaced apart. The driving chips are connected to the grounding signal wiring. The light-emitting lamp groups are connected to the power line. The partition channel wirings are connected to the light-emitting lamp groups. The power line, the grounding signal wiring, and the partition channel wirings are disposed in a same layer.

20 Claims, 3 Drawing Sheets

(56) References Cited

FOREIGN PATENT DOCUMENTS

| | | | |
|---|---|---|---|
| CN | 112230471 A | 1/2021 | |
| CN | 113129826 A | 7/2021 | |
| CN | 215814948 U | 2/2022 | |
| CN | 114171546 A | 3/2022 | |
| CN | 114185200 A | 3/2022 | |
| CN | 114677927 A | 6/2022 | |
| JP | 2012099683 A | 5/2012 | |
| JP | 2018530792 A | 10/2018 | |
| WO | 2022000619 A1 | 1/2022 | |
| WO | WO-2022015126 A1 * | 1/2022 | ............... G09G 3/32 |

OTHER PUBLICATIONS

PCT Written Opinion of the International Search Authority for International Application No. PCT/CN2022/084132, mailed on Nov. 25, 2022, 14pp.

Japanese Office Action issued in corresponding Japanese Patent Application No. 特願2022-521062 dated Jun. 4, 2024, pp. 1-6, 11pp.

Chinese Office Action issued in corresponding Chinese Patent Application No. 202210257463.0 dated Jan. 21, 2025, pp. 1-8, 17pp.

\* cited by examiner

DISPLAY PANEL

CROSS REFERENCE TO RELATED APPLICATIONS

This application is a National Phase of PCT Patent Application No. PCT/CN2022/084132 having International filing date of Mar. 30, 2022, which claims the benefit of priority of Chinese Patent Application No. 202210257463.0, filed Mar. 16, 2022, the contents of which are all incorporated herein by reference in their entirety.

BACKGROUND OF INVENTION

Field of Invention

The present application relates to a field of display technology, and specifically to a display panel.

Description of Prior Art

Mini light emitting diodes (mini-LEDs) are also known as sub-millimeter light-emitting diodes, which refer to display screens constituted by LEDs with a die (chip) size ranging from 50 microns to 200 microns and between micro LEDs and small-pitch LED display. The mini-LEDs are widely used in mini-LED direct displays and display screens of mini-LED backlights.

In current products, manners of disposing metal wirings are means of disposing two or more layers of metal wirings. For example, a grounding wiring, a partition channel wirings, and a power wiring are disposed in different layers. The manners of configuring the wirings can cause a problem that short circuit is prone to appear between different metal layers, i.e., to be short circuit easily, resulting in high cost and other problems.

SUMMARY OF INVENTION

Embodiments of the present application provide a display panel to solve the problem that the short circuit is prone to appear incurred by the grounding wiring, the partition channel wirings, and the power line being disposed in two or more layers in the prior art.

The present application provides a display panel. Wherein, the display panel includes:
 a power line,
 a grounding signal wiring spaced apart with the power line, wherein the grounding signal wiring and the signal line are arranged along a first direction;
 driving chips disposed between the power line and the grounding signal wiring and connected to the grounding signal wiring;
 light-emitting lamp groups disposed between the grounding signal wiring and the power line, wherein a terminal of the light-emitting lamp groups is connected to the power line; and
 partition channel wirings disposed between the power line and the grounding signal wiring, wherein another terminal of the light-emitting lamp groups is connected to the driving chips through the partition channel wirings; and
 wherein the power line, the partition channel wirings, and the grounding signal wiring are disposed in a same layer.

Optionally, in some embodiments of the present application, there are a plurality of the light-emitting lamp groups, the plurality of light-emitting lamp groups are arranged along the first direction, there are a plurality of the partition channel wirings, a plurality of data selection pins are disposed in the driving chips, the plurality of data selection pins are disposed along the first direction and/or a second direction intersecting with the first direction, and each of the data selection pins is connected to one of the light-emitting lamp groups through one of the partition channel wirings.

Optionally, in some embodiments of the present application, the light-emitting lamp groups include first light-emitting lamp groups and second light-emitting lamp groups, the driving chips include first data selection pins and second data selection pins, the partition channel wirings include first partition channel wirings and second partition channel wirings,
 the first light-emitting lamp groups and the second light-emitting lamp groups are arranged along the first direction, and
 the first data selection pins and the second data selection pins are arranged along the first direction; and
 wherein the first light-emitting lamp groups are connected to the first data selection pins through the first partition channel wirings, and the second light-emitting lamp groups are connected to the second data selection pins through the second partition channel wirings.

Optionally, in some embodiments of the present application, the light-emitting lamp groups further include third light-emitting lamp groups and fourth light-emitting lamp groups, third data selection pins and fourth data selection pins are disposed in the driving chips, and the partition channel wirings further include third partition channel wirings and fourth partition channel wirings;
 the first light-emitting lamp groups, the second light-emitting lamp groups, the third light-emitting lamp groups, and the fourth light-emitting lamp groups are arranged along the first direction;
 the first data selection pins and the third data selection pins are arranged into a column along the second direction, and the first data selection pins are located on a side of the third data selection pins close to the power line;
 the second data selection pins and the fourth data selection pins are arranged into another column along the second direction, and the second data selection pins are located on a side of the fourth data selection pins close to the power line; and
 wherein one of the third light-emitting lamp groups is connected to one of the third data selection pins through one of the third partition channel wirings, and one of the fourth light-emitting lamp groups is connected to one of the fourth data selection pins through one of the fourth partition channel wirings.

Optionally, in some embodiments of the present application, the driving chips include a first portion and a second portion connected the first portion, the first portion is located on a terminal portion of the driving chips close to the power line, the first data selection pins, the second data selection pins, the third data selection pins, and the fourth data selection pins are located on the first portion, the driving chips include a grounding signal pin, the grounding signal pin is connected to the grounding signal wiring, and the grounding signal pin is disposed on the second portion.

Optionally, in some embodiments of the present application, two power signal pins are disposed in the driving chips, the two power signal pins are disposed on the second portion along the first direction, the display panel includes driving chip power wirings, and the driving chip power wirings are disposed between adjacent driving chips and are configured to connect the power signal pins of the driving chips.

Optionally, in some embodiments of the present application, stage-transfer signal input pins and stage-transfer signal output pins are disposed in the driving chips, the stage-transfer signal input pins and the stage-transfer signal output pins are disposed on the second portion along the first direction, the display panel includes a driving chip signal wiring, the driving chip signal wiring is disposed between the adjacent driving chips and is configured to connect the stage-transfer signal input pins and the stage-transfer signal output pins of the adjacent driving chips.

Optionally, in some embodiments of the present application, at least one data signal pin is disposed in the driving chips, the data signal pin is disposed on the second portion, the display panel includes a data transmission wiring, and the data transmission wiring is connected to the data signal pin.

Optionally, in some embodiments of the present application, a number of the data signal pin is one, one of the data signal pin and the grounding signal pin are disposed along the first direction, and the data transmission wiring extends along the first direction and is located on a side of the data signal pins facing away from the grounding signal wiring.

Correspondingly, the present application further provides a display panel. The display panel includes:
 a power line,
 a grounding signal wiring spaced apart with the power line,
 driving chips disposed between the power line and the grounding signal wiring and connected to the grounding signal wiring;
 light-emitting lamp groups disposed between the grounding signal wiring and the power line, wherein a terminal of the light-emitting lamp groups is connected to the power line; and
 partition channel wirings disposed between the power line and the grounding signal wiring, wherein another terminal of the light-emitting lamp groups is connected to the driving chips through the partition channel wirings; and
 wherein the power line, the partition channel wirings, and the grounding signal wiring are disposed in a same layer.

Optionally, in some embodiments of the present application, there are a plurality of the light-emitting lamp groups, the plurality of light-emitting lamp groups are arranged along a first direction, there are a plurality of the partition channel wirings, a plurality of data selection pins are disposed in the driving chips, the plurality of data selection pins are disposed along the first direction and/or a second direction intersecting with the first direction, and each of the data selection pins is connected to one of the light-emitting lamp groups through one of the partition channel wirings.

Optionally, in some embodiments of the present application, the light-emitting lamp groups include first light-emitting lamp groups and second light-emitting lamp groups, the driving chips include first data selection pins and second data selection pins, the partition channel wirings include first partition channel wirings and second partition channel wirings,
 the first light-emitting lamp groups and the second light-emitting lamp groups are arranged along the first direction, and
 the first data selection pins and the second data selection pins are arranged along the first direction; and
 wherein the first light-emitting lamp groups are connected to the first data selection pins through the first partition channel wirings, and the second light-emitting lamp groups are connected to the second data selection pins through the second partition channel wirings.

Optionally, in some embodiments of the present application, the light-emitting lamp groups include third light-emitting lamp groups and fourth light-emitting lamp groups, third data selection pins and fourth data selection pins are disposed in the driving chips, and the partition channel wirings further include third partition channel wirings and fourth partition channel wirings;
 the first light-emitting lamp groups, the second light-emitting lamp groups, the third light-emitting lamp groups, and the fourth light-emitting lamp groups are arranged along the first direction, and the first light-emitting lamp groups, the second light-emitting lamp groups, the third light-emitting lamp groups, and the fourth light-emitting lamp groups are located on two opposite sides of the driving chips;
 the first data selection pins and the third data selection pins are arranged into a column along the second direction, and the first data selection pins are located on a side of the third data selection pins close to the power line;
 the second data selection pins and the fourth data selection pins are arranged into another column along the second direction, and the second data selection pins are located on a side of the fourth data selection pins close to the power line; and
 wherein one of the third light-emitting lamp groups is connected to one of the third data selection pins through one of the third partition channel wirings, and one of the fourth light-emitting lamp groups is connected to one of the fourth data selection pin through one of the fourth partition channel wirings.

Optionally, in some embodiments of the present application, the driving chips include a first portion and a second portion connected the first portion, the first portion is located on a terminal portion of the driving chips close to the power line, the first data selection pins, the second data selection pins, the third data selection pins, and the fourth data selection pins are located on the first portion, the driving chips include a grounding signal pin, the grounding signal pin is connected to the grounding signal wiring, and the grounding signal pin is disposed on the second portion.

Optionally, in some embodiments of the present application, two power signal pins are disposed in the driving chips, the two power signal pins are disposed on the second portion along the first direction, the display panel includes driving chip power wirings, and the driving chip power wirings are disposed between adjacent chips and are configured to connect the power signal pins of the driving chips.

Optionally, in some embodiments of the present application, stage-transfer signal input pins and stage-transfer signal output pins are disposed in the driving chips, the stage-transfer signal input pins and the stage-transfer signal output pins are disposed on the second portion along the first direction, the display panel includes a driving chip signal wiring, the driving chip signal wiring is disposed between the adjacent driving chips and is configured to connect the stage-transfer signal input pins and the stage-transfer signal output pins of the adjacent driving chips.

Optionally, in some embodiments of the present application, at least one data signal pin is disposed in the driving chips, the data signal pin is disposed on the second portion, the display panel includes a data transmission wiring, and the data transmission wiring is connected to the data signal pin.

Optionally, in some embodiments of the present application, a number of the data signal pin is one, one of the data signal pin and the grounding signal pin are disposed along the first direction, and the data transmission wiring extends along the first direction and is located on a side of the data signal pins facing away from the grounding signal wiring.

Optionally, in some embodiments of the present application, a number of the data signal pin is two, and two data signal pins are disposed along the first direction.

Optionally, in some embodiments of the present application, the grounding signal pin, the stage-transfer signal input pins and the stage-transfer signal output pins are located in a same column; or
the grounding signal pin and the data signal pins are located in a same column; or
the grounding signal pin and the power signal pin are located in a same column.

The present application discloses a display panel. The display panel includes a power line, light-emitting lamp groups, partition channel wirings, driving chips, and a grounding signal wiring. The grounding signal wiring is spaced apart with the power line. The driving chips are disposed between the power line and the grounding signal wiring and are connected to the grounding signal wiring. The light-emitting lamp groups are disposed between the driving chips and the power line, and a terminal of the light-emitting lamp groups is connected to the power line. The partition channel wirings are connected to the light-emitting lamp groups, and the partition channel wirings connect another terminal of the light-emitting lamp groups to the driving chips. Wherein, the power line, the partition channel wirings, and the grounding signal wiring are disposed in a same layer. In the present application, by disposing the power line, the partition channel wiring, and the grounding signal wiring in a same layer, the problem of appearance of short circuit due to the power line, the partition channel wiring, and the grounding signal wiring being disposed in different layers can be prevented, thereby improving performance of the display panels.

DESCRIPTION OF DRAWINGS

To more clearly illustrate embodiments or the technical solutions of the present application, the accompanying figures of the present application required for illustrating embodiments or the technical solutions of the present application will be described in brief. Obviously, the accompanying figures described below are only part of the embodiments of the present application, from which figures those skilled in the art can derive further figures without making any inventive efforts.

Figure 1:
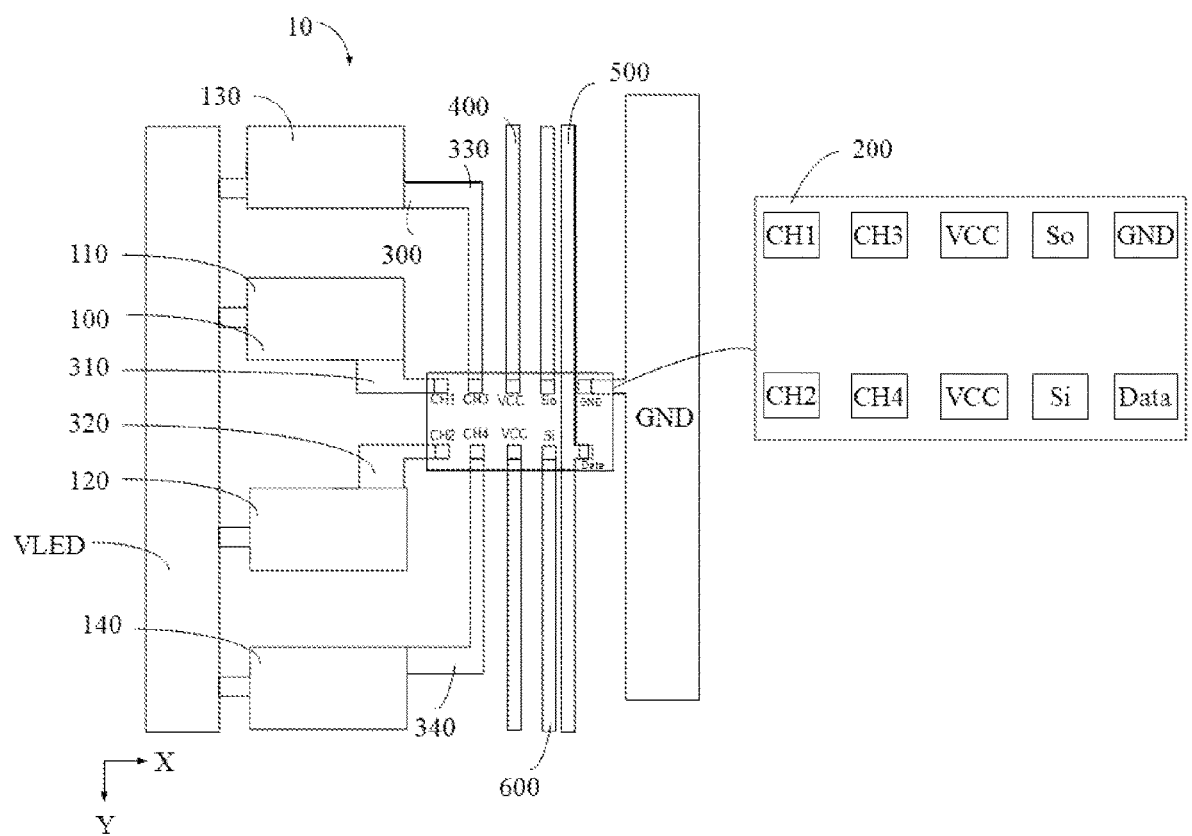
FIG. 1 is a first planar schematic diagram of a display panel provided by one embodiment of the present application.

REFERENCE NUMBERS OF ACCOMPANYING FIGURES first direction Y; second direction X; display panel 10; light-emitting lamp group 100; first light-emitting lamp group 110; second light-emitting lamp group 120; third light-emitting lamp group 130; fourth light-emitting lamp group 140; driving chip 200; partition channel wiring 300; first partition channel wiring 310; second partition channel wiring 320; third partition channel wiring 330; fourth partition channel wiring 340; driving chip power wiring 400; data transmission wiring 500; driving chip signal wiring 600.

DETAILED DESCRIPTION OF EMBODIMENTS

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application. Besides, it should be understood that the specific embodiments described herein are merely for describing and explaining the present application and are not intended to limit the present application. In the present application, unless opposite stated, the orientation words used such as "upper" and "lower" generally refer to the upper and lower directions of the device in actual using or working state, and specifically refer to the drawing directions in the drawings, and "inner" and "outer" refer to the outline of the device. In the present application, a "reaction" can be a chemical reaction or a physical reaction.

One embodiment of the present application provides a display panel. The display panel includes a power line, light-emitting lamp groups, partition channel wirings, driving chips, and a grounding signal wiring. The grounding signal wiring is spaced apart with the power line. The driving chips are disposed between the power line and the grounding signal wiring and are connected to the grounding signal wiring. The light-emitting lamp groups are disposed between the driving chips and the power line, and a terminal of the light-emitting lamp groups is connected to the power line. The partition channel wirings are disposed between the power line and the grounding signal wiring, and the partition channel wirings connect another terminal of the light-emitting lamp groups to the driving chips. Wherein, the power line, the partition channel wirings, and the grounding signal wiring are disposed in a same layer.

In the present application, by disposing the power line, the partition channel wiring, and the grounding signal wiring in a same layer, the problem of appearance of short circuit due to the power line, the partition channel wiring, and the grounding signal wiring being disposed in different layers can be prevented, thereby improving performance of the display panels.

The details are described below.

Please refer to FIG. 1. FIG. 1 is a first planar schematic diagram of a display panel provided by one embodiment of the present application. The display panel 10 includes a power line VLED, light-emitting lamp groups 100, driving chips 200, partition channel wirings 300, and a grounding signal wiring GND. The grounding signal wiring GND is spaced apart with the power line VLED. The driving chips 200 are disposed between the power line VLED and the grounding signal wiring GND and are connected to the grounding signal wiring GND. The light-emitting lamp groups 100 are disposed between the driving chips 200 and the power line VLED, and a terminal of the light-emitting lamp groups 100 is connected to the power line VLED. The partition channel wirings are disposed between the power line VLED and the grounding signal wiring GND, and the partition channel wirings connect another terminal of the light-emitting lamp groups 100 to the driving chips 200. Wherein, the power line VLED, the partition channel wirings, and the grounding signal wiring GND are disposed in a same layer.

In one embodiment, the power line VLED is disposed parallel to the grounding signal wiring GND.

The power line VLED is configured to input a power signal of an external driving element into the light-emitting lamp groups 100. The grounding signal wiring GND is a grounding wiring. The partition channel wirings 300 are configured to transmit signals in the driving chips 200 to the light-emitting lamp groups 100 A size of the driving chips 200 is less than 1500 um*1500 um.

Light emitting diode (LED) lamps are disposed in each light-emitting lamp group 100. A number of the LED lamps can be 1, 2, 4, 6, 8, 10, 12, 14 or 16 etc. A distance between the LED lamps is not limited. LED lamps can also be mini-LED lamps.

In one embodiment, a number of the light-emitting lamp groups 100 is plural. The plurality of light-emitting lamp groups 100 are arranged along the first direction Y. There are a plurality of the partition channel wirings 300. There are a plurality of driving chips 200. The plurality of driving chips 200 are arranged along the first direction Y. A plurality of data selection pins are disposed in each of the driving chips 200. The plurality of data selection pins are arranged in two rows along a second direction X intersecting with the first direction Y. Each of the data selection pins is connected to one of the light-emitting lamp groups 100 through one of the partition channel wirings 300.

In one embodiment, the light-emitting lamp groups 100 include first light-emitting lamp groups 110 and second light-emitting lamp groups 120. The light-emitting lamp groups 100 are located between the power line VLED and the partition channel wirings 300. The driving chips 200 are disposed between the light-emitting lamp groups 100 and the grounding signal wirings GND. The driving chips 200 include first data selection pins CH1 and second data selection pins CH2. The partition channel wirings 300 include first partition channel wirings 310 and second partition channel wirings 320. The first light-emitting lamp groups 110 and the second light-emitting lamp groups 120 are arranged along the first direction Y, and the first light-emitting lamp groups 110 and the second light-emitting lamp groups 120 are located on a same side of the driving chips 200. The first data selection pins CH1 and the second data selection pins CH2 are arranged along the first direction Y. Each of the first light-emitting lamp groups 110 is connected to one first data selection pin CH1 through one first partition channel wiring 310. Each of the second light-emitting lamp groups 120 is connected to one second data selection pin CH2 through one second partition channel wirings 320. The first partition channel wirings 310 and the second partition channel wirings 320 are located between the power line VLED and the grounding signal wiring GND. The first partition channel wiring 310 includes a first partition channel wiring 310 partially extending along the first direction Y and a first partition channel wiring 310 partially extending along the second direction X. The first partition channel wiring 310 extending along the second direction X is connected to the first data selection pin CH1. The second partition channel wiring 320 includes a second partition channel wiring 320 partially extending along the first direction Y and a second partition channel wiring 320 partially extending along the second direction X. The second partition channel wiring 320 extending along the second direction X is connected to the second data selection pin CH2.

In one embodiment, the light-emitting lamp groups 100 further include third light-emitting lamp groups 130 and fourth light-emitting lamp groups 140. Third data selection pins CH3 and the fourth data selection pins CH4 are further disposed in the driving chips 200. The partition channel wirings 300 further include third partition channel wirings 330 and fourth partition channel wirings 340. The first light-emitting lamp group 110, the second light-emitting lamp group 120, the third light-emitting lamp group 130, and the fourth light-emitting lamp group 140 are arranged along the first direction Y. The first light-emitting lamp groups 110 and the third light-emitting lamp groups 130, and the second light-emitting lamp groups 120 and the fourth light-emitting lamp groups 140 are located on two opposite sides of the driving chips 200. The first data selection pins CH1 and the third data selection pins CH3 are arranged into a column along the second direction X. The first data selection pins CH1 are located on a side of the third data selection pins CH3 close to the power line VLED. Each of the first light-emitting lamp groups 110 is connected to one first data selection pin CH1 through one first partition channel wiring 310. Each of the third light-emitting lamp groups 130 is connected to one of the third data selection pins CH3 through one of the third partition channel wirings 330. The second data selection pins CH2 and the fourth data selection pins CH4 are arranged into another column along the second direction X. The second data selection pins CH2 are located on a side of the fourth data selection pins CH4 close to the power line VLED. One of the fourth light-emitting lamp groups 140 is connected to one of the fourth data selection pins CH4 through one of the fourth partition channel wirings 340.

Specifically, the first partition channel wiring 310 is located between the third partition channel wiring 330 and the power line VLED, and the first partition channel wiring 310 is close to a side of the first light-emitting lamp groups 110. The third partition channel wiring 330 includes a third partition channel wiring 330 partially extending along the first direction Y and a third partition channel wiring 330 partially extending along the second direction X. The third partition channel wiring 330 extending along the first direction Y is connected to the third data selection pin CH3. Each of the fourth partition channel wiring 340 includes a fourth partition channel wiring 340 partially extending along the first direction Y and a fourth partition channel wiring 340 partially extending along the second direction X. The fourth partition channel wiring 340 extending along the first direction Y is connected to the fourth data selection pin CH4. The fourth partition channel wiring 340 is located on a side of the second partition channel wiring 320 away from the power line VLED.

It should be noted that arrangement positions of the third light-emitting lamp groups 130, the first light-emitting lamp groups 110, the second light-emitting lamp groups 120, and the fourth light-emitting lamp groups 140 can also be swapped into other arrangement sequences, and corresponding pins and wirings are also changed.

In one embodiment, the display panel 10 can only provided with one of the third light-emitting lamp groups 130 or the fourth light-emitting lamp groups 140. The display panel 10 can be provided with only one of the third partition channel wiring 330 or the fourth partition channel wiring 340. The driving chips 200 can be provided with only one of the third data selection pin CH3 or the fourth data selection pin CH4.

In one embodiment, the first partition channel wiring 310 and the second partition channel wiring 320, and the third partition channel wiring 330 and the fourth partition channel wiring 340 are arranged in parallel and are spaced apart.

In one embodiment, the driving chips 200 include a first portion and a second portion connected the first portion. The first portion is located on a terminal portion of the driving chips 200 close to the power line VLED. The first data selection pins CH1, the second data selection pins CH2, the third data selection pins CH3, and the fourth data selection pins CH4 are located on the first portion. The driving chips 200 include a grounding signal pin GND. The grounding signal pin GND is connected to the grounding signal wiring GND. The grounding signal pin GND is disposed on the second portion. Specifically, the first data selection pin CH1, the third data selection pin CH3, and the grounding signal pin GND are sequentially arranged into a column along the second direction X, or the second data selection pin CH2, the fourth data selection pin CH4, and the grounding signal pin GND are sequentially arranged into a column along the second direction X, or the grounding signal pin GND form a column along the second direction X or the first direction Y independently.

In one embodiment, two power signal pins Vcc are disposed in the driving chips 200. The two power signal pins Vcc are disposed on the second portion along the first direction. The display panel 10 includes driving chip power wirings 400. The driving chip power wirings 400 are disposed between adjacent driving chips 200 and are configured to connect the power signal pins Vcc of the driving chips 200. Specifically, the two power signal pins Vcc include a first power signal pin Vcc and a second power signal pin Vcc. The first data selection pin CH1, the third data selection pin CH3, the first power signal pin Vcc, and the grounding signal pin GND are sequentially arranged into a column along the second direction X, and the second data selection pin CH2, the fourth data selection pin CH4, and the second power supply pin Vcc are sequentially arranged into a column along the second direction X. Or, the first data selection pin CH1, the third data selection pin CH3, and the first power signal pin Vcc are sequentially arranged into a column along the second direction X, and the second data selection pin CH2, the fourth data selection pin CH4, the second power signal pin Vcc, and the grounding signal pin GND are sequentially arranged into a column along the second direction X. The first power pin Vcc and the second power signal pin Vcc are sequentially arranged into column along the first direction Y. The first power signal pin Vcc and the second power signal pin Vcc of the adjacent driving chips 200 are connected through the driving chip power wiring 400. The driving chip power wiring 400 is located between the fourth partition channel wiring 340 and the grounding signal wiring GND.

In one embodiment, stage-transfer signal input pins Si and stage-transfer signal output pins So are disposed in the driving chips 200. The stage-transfer signal input pins Si and the stage-transfer signal output pins So are disposed on the second portion along the first direction Y. The display panel 10 further includes a driving chip signal wiring 600. The driving chip signal wiring 600 is disposed between the adjacent driving chips 200 and is configured to connect the stage-transfer signal input pins Si and the stage-transfer signal output pins So of the adjacent driving chips 200. Sequentially, the first data selection pin CH1, the third data selection pin CH3, the first power signal pin Vcc, the stage-transfer signal output pins So, and the grounding signal pin GND are sequentially arranged into a column along the second direction X, and the second data selection pin CH2, the fourth data selection pin CH4, the second power signal pin Vcc, the stage-transfer signal input pins Si, and the grounding signal pin GND are sequentially arranged into a column along the second direction X. The stage-transfer signal output pins So and the stage-transfer signal input pins Si are sequentially arranged into a column along the first direction Y, or the stage-transfer signal output pins So, the grounding signal pins GND, and the stage-transfer signal input pins Si are sequentially arranged into a column along the first direction Y, i.e., the grounding signal pins GND, the stage-transfer signal input pins Si, and the stage-transfer signal output pins So are located in a same column. The stage-transfer signal input pins Si and the stage-transfer signal output pins So of adjacent driving chips 200 are connected through the driving chip signal wiring 600. The driving chip signal wiring 600 is located between the driving chip power wiring 400 and the grounding signal wiring GND.

In one embodiments, the driving chip power wiring 400, the data transmission wiring 500, and the driving chip signal wiring 600 extend along the first direction Y and are disposed in a parallel manner.

In one embodiment, at least one data signal pin Data is disposed in the driving chips 200. The data signal pin Data is disposed on the second portion. The display panel includes a data transmission wiring 500. The data transmission wiring 500 is connected to the data signal pin Data. Specifically, a number of the data signal pin Data is one. One data signal pin Data and the grounding signal pin GND are disposed along the first direction Y. The data transmission wiring 500 extends along the first direction Y and is located on a side of the data signal pins Data facing away from the grounding signal wiring GND. Furthermore, the first data selection pin CH1, the third data selection pin CH3, the first power signal pin Vcc, the stage-transfer signal output pins So, and the grounding signal pin GND are sequentially arranged into a column along the second direction X. The second data selection pin CH2, the fourth data selection pin CH4, the second power signal pin Vcc, the stage-transfer signal input pins Si, and the data signal pin Data are sequentially arranged into a column along the second direction X, i.e., the grounding signal pin GND and the data signal pins Data are located in a same column. Or, the first data selection pin CH1, the third data selection pin CH3, the first power signal pin Vcc, the stage-transfer signal output pins So, and the data signal pin Data are sequentially arranged into a column along the second direction X. The second data selection pin CH2, the fourth data selection pin CH4, the second power signal pin Vcc, the stage-transfer signal input pins Si, and the grounding signal pin GND are sequentially arranged into a column along the second direction X, i.e., the grounding signal pin GND and the power signal pin Vcc are located in a same column. The data transmission wiring 500 is located between the driving chip power wiring 600 and the grounding signal wiring GND. Each data transmission wiring 500 is connected to the data signal pins Data of the plurality of driving chips 200.

In one embodiments, the driving chip power wiring 400, the data transmission wiring 500, and the driving chip signal wiring 600 extend along the first direction Y and are disposed in a parallel manner.

In one embodiment, the first data selection pin CH1, the third data selection pin CH3, the first power signal pin Vcc, the stage-transfer signal output pin So, and the grounding signal pin GND constitute a plurality of first pins. The second data selection pin CH2, the fourth data selection pin CH4, the second power signal pin Vcc, the stage-transfer signal input pin Si, and the data signal pin Data constitute a plurality of second pins. The first pins and the second pins are symmetrically disposed.

It should be noted that pins disposed on the first portion can be swapped, positions of the first power signal pin Vcc, the second power signal pin Vcc, the stage-transfer signal output pin So, and the stage-transfer signal input pin Si can also be swapped, i.e., positions of the first data selection pins CH1, the second data selection pins CH2, the third data selection pins CH3, and the fourth data selection pins CH4 can be swapped. When the positions of the first data selection pins CH1, the second data selection pins CH2, the third data selection pins CH3, and the fourth data selection pins CH4 are swapped, positions of the corresponding first partition channel wiring 310, second partition channel wiring 320, third partition channel wiring 330, and fourth partition channel wiring 340 are correspondingly swapped. Positions of the first power signal pin Vcc, the second power signal pin Vcc, the stage-transfer signal output pin So, and the stage-transfer signal input pin Si can be swapped. When the positions of the first power signal pin Vcc, the second power signal pin Vcc, the stage-transfer signal output pin So, and the stage-transfer signal input pin Si are swapped, positions of the driving chip power wiring 400, the driving chip signal wiring 600, and the data transmission wiring 500 are changed correspondingly. The data signal pin Data and the grounding signal pin GND can also be swapped. When they are swapped, positions of the data transmission wiring 500 and the grounding signal wiring GND are also swapped.

For example, the first data selection pin CH1, the third data selection pin CH3, the first power signal pin Vcc, the stage-transfer signal output pin So, and the grounding signal pin GND are sequentially arranged into a column along the second direction X. The second data selection pin CH2, the fourth data selection pin CH4, the second power signal pin Vcc, the stage-transfer signal input pins Si, and the data signal pin Data are sequentially arranged along the second direction X. The first data selection pin CH1, the third data selection pin CH3, the first power signal pin Vcc, the stage-transfer signal output pin So, and the grouping signal pin GND are located on a side of the driving chips 200 close to the first light-emitting lamp groups 110 and the third light-emitting lamp groups 130. The second data selection pin CH2, the fourth data selection pin CH4, the second power signal pin Vcc, the stage-transfer signal input pin Si, and the data signal pin Data are located on a side of the driving chips 200 close to the second light-emitting lamp groups 120 and the fourth light-emitting lamp groups 140. The first data selection pins CH1 are symmetrically disposed with the second data selection pins CH2. The third data selection pins CH3 are symmetrically disposed with the fourth data selection pins CH4. The first power signal pin Vcc is symmetrically disposed with the second power signal pin Vcc. The stage-transfer signal input pin Si is symmetrically disposed with the stage-transfer signal output pin So.

Furthermore, the first partition channel wiring 310 is located between the power line VLED and the third partition channel wiring 330. The driving chip power wiring 400 is located on a side of the third partition channel wiring 330 away from the power line VLED. The second partition channel wiring 320 is located between the power line VLED and the fourth partition channel wiring 340. The driving chip power wiring 400 is located on a side of the fourth partition channel wiring 340 away from the power line VLED. The driving chip signal wiring 600 is located on a side of the driving chip power wiring 400 away from the power line VLED. The data transmission wiring 500 is located between the driving chip power wiring 600 and the grounding signal wiring GND. The grounding signal wiring GND is located on a side of the driving chip signal wiring 600 away from the power line VLED, and the first partition channel wiring 310, the power line VLED, the third partition channel wiring 330, the fourth partition channel wiring 340, the driving chip power wiring 400, the data transmission wiring 500, the driving chip signal wiring 600, the second partition channel wiring 320, and the grounding signal wiring GND are in a same layer and are spaced apart.

In the present application, by disposing the first partition channel wiring 310, the power line VLED, the third partition channel wiring 330, the fourth partition channel wiring 340, the driving chip power wiring 400, the data transmission wiring 500, the driving chip signal wiring 600, the second partition channel wiring 320, and the grounding signal wiring GND in the same layer and spaced apart, and by configuring the positions of the corresponding pins, jumper wires of the wirings are allowed to be reduced, thereby preventing the problem of short circuit easily appearing. Therefore, yield of the display panel 10 is improved, and cost is reduced.

Working principle: a positive voltage of the LED lamp is transmitted to the light-emitting lamp groups 100 through the power line VLED; the driving chip 200 is a driving chip 200 that outputs a constant current source; after a data signal, a power signal, a grounding signal, and a stage-transfer signal are transmitted to the driving chip 200, the data signal is processed by the driving chip 200, is converted into an output current of each output, and is transmitted to each light-emitting lamp group to make it emit light normally, i.e., makes display panel 10 work.

Figure 2:
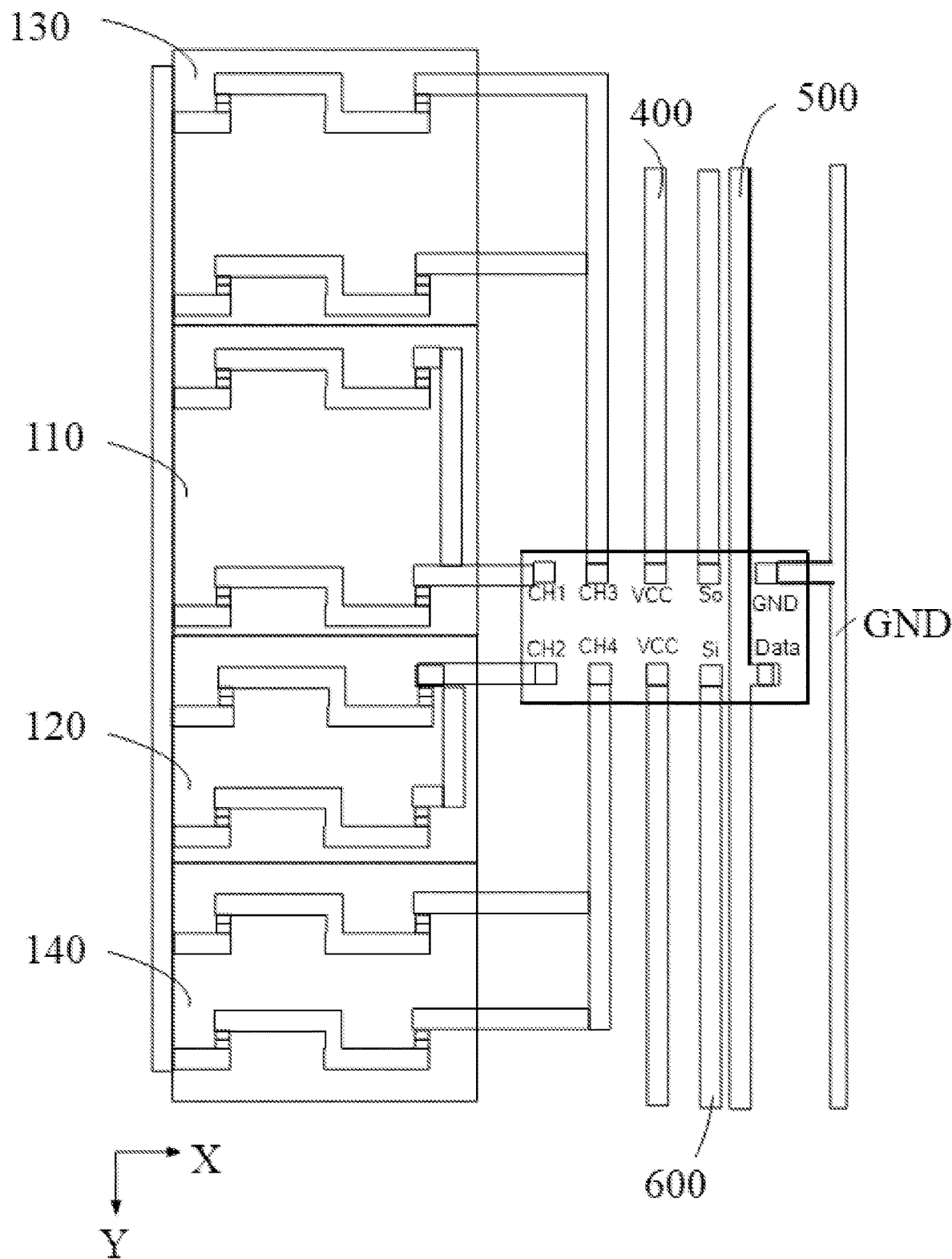
FIG. 2 is a planar schematic diagram of light-emitting lamp groups of the display panel provided by one embodiment of the present application.
Figure 3:
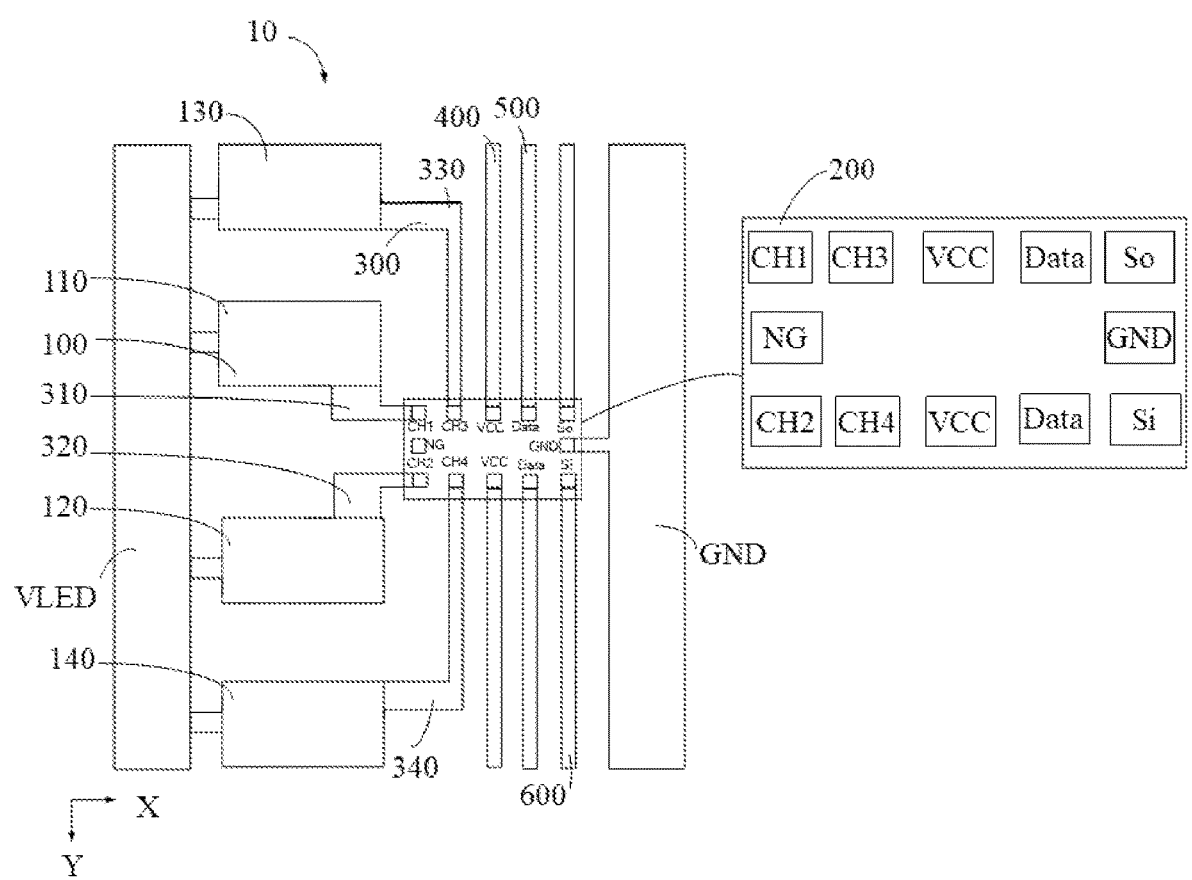
FIG. 3 is a second planar schematic diagram of the display panel provided by one embodiment of the present application.

Please refer to FIG. 2. FIG. 2 is a planar schematic diagram of light-emitting lamp groups 100 of the display panel 10 provided by one embodiment of the present application. FIG. 3 is a second planar schematic diagram of the display panel 10 provided by one embodiment of the present application. The light emitting diodes (LEDs) in the light-emitting lamp groups 100 can be configured to be in series connection or parallel connection two by two.

Please refer to FIG. 3. It should be noted that the difference between the second structure and the first structure is that:

A number of the data signal pins Data is two, and the two data signal pins Data are disposed along the first direction Y. Specifically, the data signal pins Data include a first data signal pin Data and a second data signal pin Data. The first power signal pin Vcc, the second power signal pin Vcc, the stage-transfer signal output pin So, the stage-transfer signal input pin Si, the first data signal pin Data, and the second data signal pin Data are located on the second portion. The first data selection pin CH1, the third data selection pin CH3, the first power signal pin Vcc, the first data signal pin Data, and the stage-transfer signal output pin So are sequentially arranged into a column along the second direction X. The second data selection pin CH2, the fourth data selection pin CH4, the second power signal pin Vcc, the second data signal pin Data, and the stage-transfer signal input pins Si are sequentially arranged into a column along the second direction X. The stage-transfer signal output pins So, the grounding signal pins GND, and the stage-transfer signal output pins So are sequentially arranged into a column along the first direction Y, i.e., the first data signal pins Data are symmetrically disposed with the second data signal pins Data, and the data transmission wiring 500 is disposed between two adjacent driving chips 200. The first data signal pins Data and the second data signal pins Data of the two adjacent driving chips 200 are connected through the data transmission wiring 500.

In one embodiment, the driving chips 200 further include an idle pin NG. The idle pin NG is located on the first portion. The first data selection pins CH1, the idle pin NG, and the second data selection pins CH2 are sequentially arranged into a column along the first direction Y.

It should be noted that positions of the first power signal pin Vcc, the second power signal pin Vcc, the stage-transfer signal output pin So, the stage-transfer signal input pin Si, the first data signal pin Data, and the second data signal pin Data on the first portion can be swapped, and positions of corresponding wiring can also be swapped correspondingly.

For example, the first data selection pin CH1, the third data selection pin CH3, the first power signal pin Vcc, the first data signal pin Data, and the stage-transfer signal output pin So are sequentially arranged along the second direction X. The second data selection pin CH2, the fourth data selection pin CH4, the second power signal pin Vcc, the second data signal pin Data, and the stage-transfer signal input pins Si are sequentially arranged along the second direction X. The idle pin NG and the grounding signal pin GND are sequentially arranged along the second direction X, the first data selection pins, the idle pin, and the second data selection pins are arranged along the first direction Y, and the first data selection pins, the idle pin NG, and the second data selection pin are located on a side of the driving chips 200 close to the power line VLED. The stage-transfer signal output pin So, the grounding signal pin GND, and the stage-transfer signal input pin Si are sequentially arranged along the first direction Y, and the stage-transfer signal output pin So, the grounding signal pin GND, and the stage-transfer signal input pin Si are located on a side of the second portion away from the power line VLED. The first data selection pin CH1, the third data selection pin CH3, the first power signal pin Vcc, the first data signal pin Data, and the stage-transfer signal output pin So are located on a side of the driving chips 200 close to the first light-emitting lamp groups 110. The second data selection pin CH2, the fourth data selection pin CH4, the second power signal pin Vcc, the second data signal pin Data, and the stage-transfer signal input pin Si are located on a side of the driving chips 200 close to the second light-emitting lamp groups 120. The data transmission wiring 500 is located on a side of the driving chip power wiring 400 away from the power line VLED and is located between the data transmission wiring 500 and the grounding signal wiring GND. The second partition channel wiring is located between the power line VLED and the fourth partition channel wiring 340. The driving chip signal wiring 600 is located between the data transmission wiring 500 and the grounding signal wiring GND, and the first partition channel wiring 310, the power line VLED, the third partition channel wiring 330, the fourth partition channel wiring 340, the driving chip power wiring 400, the data transmission wiring 500, the driving chip signal wiring 600, the second partition channel wiring 320, and the grounding signal wiring GND are in a same layer and are spaced apart.

In the present application, by disposing the first partition channel wiring 310, the power line VLED, the third partition channel wiring 330, the fourth partition channel wiring 340, the driving chip power wiring 400, the data transmission wiring 500, the driving chip signal wiring 600, the second partition channel wiring 320, and the grounding signal wiring GND in the same layer and spaced apart, and by configuring the positions of the corresponding pins, jumper wires of the wirings are allowed to be reduced, thereby preventing the problem of short circuit easily appearing. Therefore, yield of the display panel 10 is improved, and cost is reduced. Meanwhile, disposing the idle pin in the driving chips 200 allows arrangement the pins of the driving chips 200 to be balanced and symmetrical, simplifies manufacturing processes of the driving chips 200, and shortens manufacturing periods, thereby reducing cost.

It should be noted that the display panel 10 provided by the present application can be products of mini-LED backlight sources or products of mini-LED display screens.

The present application discloses a display panel 10. The display panel 10 includes a power line VLED, light-emitting lamp groups 100, driving chips 200, partition channel wirings 300, and a grounding signal wiring GND. The grounding signal wiring GND is spaced apart with the power line VLED. The driving chips 200 are disposed between the power line VLED and the grounding signal wiring GND and are connected to the grounding signal wiring GND. The light-emitting lamp groups 100 are disposed between the driving chips 200 and the power line VLED, and a terminal of the light-emitting lamp groups 100 is connected to the power line VLED. The partition channel wirings are disposed between the power line VLED and the grounding signal wiring GND, and the partition channel wirings connect another terminal of the light-emitting lamp groups 100 to the driving chips 200. Wherein, the power line VLED, the partition channel wirings, and the grounding signal wiring GND are disposed in a same layer. In the present application, by disposing the power line VLED, the partition channel wiring, and the grounding signal wiring GND in a same layer, and by changing arrangement design of pins in the driving chips 200, the problem of short circuit easily appearing due to the power line VLED, the partition channel wiring, and the grounding signal wiring GND being disposed in different layers can be prevented, while the cost is disposed, thereby improving performance of the display panels 10.

The above describes the display panel provided by the embodiments of the present application in detail. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present application. In summary, the content of the specification should not be understood as limit to the present application.

What is claimed is:
1. A display panel, wherein the display panel comprises:
a power line,
a grounding signal wiring spaced apart with the power line, wherein the grounding signal wiring and the signal line are arranged along a first direction;
driving chips disposed between the power line and the grounding signal wiring and connected to the grounding signal wiring;
light-emitting lamp groups disposed between the grounding signal wiring and the power line, wherein a terminal of the light-emitting lamp groups is connected to the power line; and
partition channel wirings disposed between the power line and the grounding signal wiring, wherein another ter- minal of the light-emitting lamp groups is connected to the driving chips through the partition channel wirings; and wherein the power line, the partition channel wirings, and the grounding signal wiring are disposed in a same layer.

2. The display panel as claimed in claim 1, wherein light-emitting lamp groups are arranged along the first direction; a plurality of data selection pins are disposed in the driving chips; the plurality of data selection pins are disposed along the first direction and a second direction intersecting with the first direction, or the plurality of data selection pins are disposed along the first direction or the second direction intersecting with the first direction; and each of the data selection pins is connected to one of the light-emitting lamp groups through one of the partition channel wirings.

3. The display panel as claimed in claim 1, wherein the light-emitting lamp groups comprise first light-emitting lamp groups and second light-emitting lamp groups, the driving chips comprise first data selection pins and second data selection pins, the partition channel wirings comprise first partition channel wirings and second partition channel wirings, the first light-emitting lamp groups and the second light-emitting lamp groups are arranged along the first direction, and the first data selection pins and the second data selection pins are arranged along the first direction; and wherein the first light-emitting lamp groups are connected to the first data selection pins through the first partition channel wirings, and the second light-emitting lamp groups are connected to the second data selection pins through the second partition channel wirings.

4. The display panel as claimed in claim 3, wherein the light-emitting lamp groups comprise third light-emitting lamp groups and fourth light-emitting lamp groups, third data selection pins and fourth data selection pins are disposed in the driving chips, and the partition channel wirings comprise third partition channel wirings and fourth partition channel wirings;

the first light-emitting lamp groups, the second light-emitting lamp groups, the third light-emitting lamp groups, and the fourth light-emitting lamp groups are arranged along the first direction;

the first data selection pins and the third data selection pins are arranged into a column along the second direction, and the first data selection pins are located on a side of the third data selection pins close to the power line;

the second data selection pins and the fourth data selection pins are arranged into another column along the second direction, and the second data selection pins are located on a side of the fourth data selection pins close to the power line; and wherein one of the third light-emitting lamp groups is connected to one of the third data selection pins through one of the third partition channel wirings, and one of the fourth light-emitting lamp groups is connected to one of the fourth data selection pin through one of the fourth partition channel wirings.

5. The display panel as claimed in claim 4, wherein the driving chips comprise a first portion and a second portion connected the first portion, the first portion is located on a terminal portion of the driving chips close to the power line, the first data selection pins, the second data selection pins, the third data selection pins, and the fourth data selection pins are located on the first portion, the driving chips comprise a grounding signal pin, the grounding signal pin is connected to the grounding signal wiring, and the grounding signal pin is disposed on the second portion.

6. The display panel as claimed in claim 5, wherein two power signal pins are disposed in the driving chips, the two power signal pins are disposed on the second portion along the first direction, the display panel comprises driving chip power wirings, and the driving chip power wirings are disposed between adjacent driving chips and are configured to connect the power signal pins of the driving chips.

7. The display panel as claimed in claim 6, wherein stage-transfer signal input pins and stage-transfer signal output pins are disposed in the driving chips, the stage-transfer signal input pins and the stage-transfer signal output pins are disposed on the second portion along the first direction, the display panel comprises a driving chip signal wiring, the driving chip signal wiring is disposed between the adjacent driving chips and is configured to connect the stage-transfer signal input pins and the stage-transfer signal output pins of the adjacent driving chips.

8. The display panel as claimed in claim 7, wherein at least one data signal pin is disposed in the driving chips, the data signal pin is disposed on the second portion, the display panel comprises a data transmission wiring, and the data transmission wiring is connected to the data signal pin.

9. The display panel as claimed in claim 8, wherein a number of the data signal pin is one, one of the data signal pin and the grounding signal pin are disposed along the first direction, and the data transmission wiring extends along the first direction and is located on a side of the data signal pin facing away from the grounding signal wiring.

10. A display panel, wherein the display panel comprises:
a power line,
a grounding signal wiring spaced apart with the power line,
driving chips disposed between the power line and the grounding signal wiring and connected to the grounding signal wiring;
light-emitting lamp groups disposed between the grounding signal wiring and the power line, wherein a terminal of the light-emitting lamp groups is connected to the power line; and
partition channel wirings disposed between the power line and the grounding signal wiring, wherein another terminal of the light-emitting lamp groups is connected to the driving chips through the partition channel wirings; and
wherein the power line, the partition channel wirings, and the grounding signal wiring are disposed in a same layer.

11. The display panel as claimed in claim 10, wherein light-emitting lamp groups are arranged along the first direction; a plurality of data selection pins are disposed in the driving chips; the plurality of data selection pins are disposed along the first direction and a second direction intersecting with the first direction, or the plurality of data selection pins are disposed along the first direction or the second direction intersecting with the first direction; and each of the data selection pins is connected to one of the light-emitting lamp groups through one of the partition channel wirings.

12. The display panel as claimed in claim 10, wherein the light-emitting lamp groups comprise first light-emitting lamp groups and second light-emitting lamp groups, the driving chips comprise first data selection pins and second data selection pins, the partition channel wirings comprise first partition channel wirings and second partition channel wirings, the first light-emitting lamp groups and the second light-emitting lamp groups are arranged along the first direction, and the first data selection pins and the second data selection pins are arranged along the first direction; and wherein the first light-emitting lamp groups are connected to the first data selection pins through the first partition channel wirings, and the second light-emitting lamp groups are connected to the second data selection pins through the second partition channel wirings.

13. The display panel as claimed in claim 12, wherein the light-emitting lamp groups comprise third light-emitting lamp groups and fourth light-emitting lamp groups, third data selection pins and fourth data selection pins are disposed in the driving chips, and the partition channel wirings comprise third partition channel wirings and fourth partition channel wirings;

the first light-emitting lamp groups, the second light-emitting lamp groups, the third light-emitting lamp groups, and the fourth light-emitting lamp groups are arranged along the first direction;

the first data selection pins and the third data selection pins are arranged into a column along the second direction, and the first data selection pins are located on a side of the third data selection pins close to the power line;

the second data selection pins and the fourth data selection pins are arranged into another column along the second direction, and the second data selection pins are located on a side of the fourth data selection pins close to the power line; and wherein one of the third light-emitting lamp groups is connected to one of the third data selection pins through one of the third partition channel wirings, and one of the fourth light-emitting lamp groups is connected to one of the fourth data selection pins through one of the fourth partition channel wirings.

14. The display panel as claimed in claim 13, wherein the driving chips comprise a first portion and a second portion connected the first portion, the first portion is located on a terminal portion of the driving chip close to the power line, the first data selection pins, the second data selection pins, the third data selection pins, and the fourth data selection pins are located on the first portion, the driving chips comprise a grounding signal pin, the grounding signal pin is connected to the grounding signal wiring, and the grounding signal pin is disposed on the second portion.

15. The display panel as claimed in claim 14, wherein two power signal pins are disposed in the driving chips, the two power signal pins are disposed on the second portion along the first direction, the display panel comprises driving chip power wirings, and the driving chip power wirings are disposed between adjacent driving chips and are configured to connect the power signal pins of the driving chips.

16. The display panel as claimed in claim 15, wherein stage-transfer signal input pins and stage-transfer signal output pins are disposed in the driving chips, the stage-transfer signal input pins and the stage-transfer signal output pins are disposed on the second portion along the first direction, the display panel comprises a driving chip signal wiring, the driving chip signal wiring is disposed between the adjacent driving chips and is configured to connect the stage-transfer signal input pins and the stage-transfer signal output pins of the adjacent driving chips.

17. The display panel as claimed in claim 16, wherein at least one data signal pin is disposed in the driving chips, the data signal pin is disposed on the second portion, the display panel comprises a data transmission wiring, and the data transmission wiring is connected to the data signal pin.

18. The display panel as claimed in claim 17, wherein a number of the data signal pin is one, one of the data signal pin and the grounding signal pin are disposed along the first direction, and the data transmission wiring extends along the first direction and is located on a side of the data signal pins facing away from the grounding signal wiring.

19. The display panel as claimed in claim 17, wherein a number of the data signal pin is two, and two data signal pins are disposed along the first direction.

20. The display panel as claimed in claim 19, wherein the grounding signal pin, the stage-transfer signal input pins and the stage-transfer signal output pins are located in a same column; or the grounding signal pin and the data signal pins are located in a same column; or the grounding signal pin and the power signal pin are located in a same column.

\* \* \* \* \*